United States Patent [19]

Moore et al.

[11] Patent Number: 4,877,718

[45] Date of Patent: Oct. 31, 1989

[54] POSITIVE-WORKING PHOTOSENSITIVE POLYIMIDE OPERATED BY PHOTO INDUCED MOLECULAR WEIGHT CHANGES

[75] Inventors: James A. Moore; Andrew N. Dasheff, both of Troy; Frank B. Kaufman, Amawalk, all of N.Y.

[73] Assignees: Rennsselaer Polytechnic Institute, Troy; International Business Machines Corporation, Armonk, both of N.Y.

[21] Appl. No.: 249,393

[22] Filed: Sep. 26, 1988

[51] Int. Cl.[4] .................................................. G03C 5/16
[52] U.S. Cl. ...................................... 430/326; 430/283; 430/311; 430/315; 528/310
[58] Field of Search ............... 430/326, 270, 311, 942, 430/283

[56] References Cited

U.S. PATENT DOCUMENTS

| | | | |
|---|---|---|---|
| 4,112,139 | 9/1978 | Shirk et al. | 430/283 |
| 4,414,059 | 11/1983 | Blum et al. | 156/659.1 |
| 4,508,749 | 4/1985 | Brannon et al. | 427/43.1 |
| 4,568,632 | 2/1986 | Blum et al. | 430/322 |
| 4,579,809 | 4/1986 | Irving | 430/283 |
| 4,612,275 | 9/1986 | Gregor | 430/296 |
| 4,655,874 | 4/1987 | Marks | 156/643 |

FOREIGN PATENT DOCUMENTS 0130481  9/1985  European Pat. Off. .

OTHER PUBLICATIONS

Crivello et al., J. Polym. Sci., Polym. Chem. Ed. 1987, 25 3293-3309; "Photodimerization of Maleic Anhydride".
Boule et al., Tetrahedron Letters No. 11, pp. 865≅868, 1976; "Synthesis and Characterization of Photo Sensitive Polyimides".
Barltrop et al, Chemical Communications, pp. 822, 823, Nov. 22, 1966; "Photosensitive Protective Groups".
IBM Tech. Disclosure Bulletin, vol. 16, No. 2, Jul. 1973; pp. 601, 602.
IBM Tech. Disclosure Bulletin, vol. 22, No. 6, Nov. 1979; pp. 2254, 2255.
Yoda et al, J. Macromol. Sci-Chem, A21(13 & 14) pp. 1641-1663 (1984); "New Photosensitive High Temperature Polymers for Electronic Applications".

*Primary Examiner*—Paul R. Michl
*Assistant Examiner*—C. D. RoDee
*Attorney, Agent, or Firm*—Notaro & Michalos

[57] ABSTRACT

An insoluble photosensitive polyimide having the formula

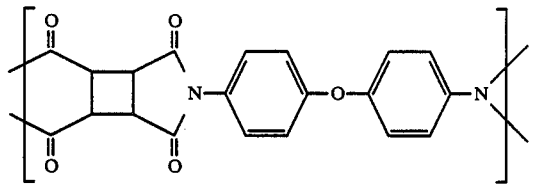

can be exposed by a pattern of light to render the exposed areas soluble. The exposed areas can then be dissolved using a solvent to leave the pattern which can be used directly as an insulator layer in a semiconductor device. A process for preparing the photosensitive soluble polyimide utilizes maleic anhydride which is irradiated by ultraviolet light to form a cyclobutane unit which is reacted with oxydianiline to form polymic acid. The polymic acid is cured using heat into the photosensitive soluble polyimide.

6 Claims, 4 Drawing Sheets

POSITIVE-WORKING PHOTOSENSITIVE POLYIMIDE OPERATED BY PHOTO INDUCED MOLECULAR WEIGHT CHANGES

FIELD AND BACKGROUND OF THE INVENTION

The present invention relates in general to photolithography techniques for producing semiconductor devices and the like, and in particular to a new and useful method of forming a pattern in an insulator layer for a semiconductor structure utilizing a photosensitive polyimide which becomes soluble when exposed to light.

In the fabrication of multi-level metal-insulator integrated circuit structures, a polyimide known as Kapton (a trademark of DuPont) has proven to be a good insulator when applied between metallization layers in integrated circuit structures. This is because of the high thermal stability, chemical resistance and dielectric properties of Kapton polyimide. Kapton polyimide has the following formula:

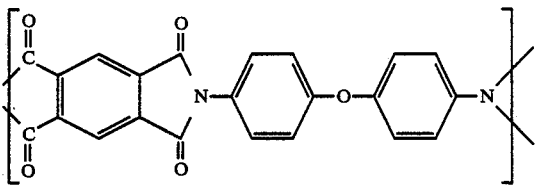

An intermediate polyamic acid which is subjected to heat to form the Kapton polyimide, is itself soluble and can be spun into films which can be cured into the insoluble polyimide structures. Once the material is cured, it is generally insoluble and infusible and is extremely thermally stable. The insolubility and the infusibility of the Kapton polyimide requires that patterning of the polyimide layers be accomplished indirectly by photoresist technology. This process entails the spinning and curing of the polyimide layer, formation of a polysulfone lift-off layer and deposition of an SiO$_2$ masking layer followed by a top layer of resist coating.

The pattern is defined by either electron beam or optical lithography and the underlying layers are etched with reactive ion etching. Metal is deposited onto the pattern and the polysulfone and excess are lifted off with a solvent.

If the polyimide layer itself could be made intrinsically photosensitive, the formation of a pattern in the polyimide layer would be greatly simplified. Several photonegative polyimide systems have been developed which utilize photosensitive polyimides. These are generally made by the reaction of the corresponding polyamic acid with a photosensitive group. In the most common case, the intermediate polyamic acid is partially esterified with photo-crosslinkable alcohols. Irradiation of these esters causes them to become insoluble and enables them to be used to form negative images upon treatment with solvent. After imaging, the films are thermally converted to the polyimide which itself is not sensitive to light.

A photopositive system would be more desirable because of the swelling attendant upon solvent development of negative images. A photopositive polyimide containing photosensitive sulfonium salt units has been described in a article by Crivello et al. entitled "Synthesis and Characterization of Photosensitive Polyimides", *Journal of Polymer Science: Part A: Polymer Chemistry*, Vol. 25, 3293–3309 (1987).

A polyimide resin which has good transparency and is useful to produce molded products with substantially no coloring and good thermal resistance, is disclosed in European Patent Application 0 130 481 to Noriaki et al. This reference does not consider or discuss the possibility of photosensitivity for the polyimide product.

SUMMARY OF THE INVENTION

The present invention involves a process for making and using an intrinsically photosensitive polyimide so that direct, positive photoimaging can be accomplished even after a complete thermal curing which forms the polyimide structure has taken place.

The process for preparing the intrinsically photosensitive polyimide comprises irradiating maleic anhydride (MA) solution with ultraviolet light. See "Photodimerization of Maleic Anhydride in Carbon Tetrachloride", Boulet et al., *Tetrahedron Letters*, No. 11, pp. 865–868 (1976). This excites the anhydride molecule to dimerize and form a cyclobutane unit. Because the olefin is consumed in the dimerization process, ultraviolet absorption of the cyclobutane unit shifts to a shorter wavelength. Thus, once the anhydride is formed, it can be used to form a polyimide which can be imaged by irradiation at a wavelength which corresponds to energy absorption by the cyclobutane structure.

The cyclobutane unit is reacted with an aromatic diamine, such as oxydianiline (ODA) to form a polyamic acid which can thereafter be heat cured to produce the corresponding and intrinsically photosensitive, polyimide which, depending on the diamine used, may be insoluble.

The invention also includes a method of forming a patterned insulator layer useful for example in a semiconductor structure, which comprises forming a layer of the intrinsically photosensitive soluble or insoluble polyimide, irradiating the layer with a pattern of light to produce exposed and unexposed areas in the layer, the exposed areas becoming soluble and applying a solvent to the layer to remove the soluble exposed areas to form the patterned insulator layer.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DESCRIPTION OF THE PREFERRED EMBODIMENT

EXAMPLE 1

The inherently photosensitive positive acting polyimide in accordance with the present invention is prepared by irradiating a solution of maleic anhydride (I) in carbon tetrachloride or other suitable solvent with light at a maximum wavelength of 280 nm from a high power mercury arc lamp for one hour. This forms 1, 2, 3, 4-cyclobutane tetracarboxylic 1,2:3,4-dianhydride (CBDA) shown at II in the Equation 1.

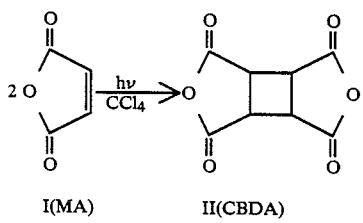

I(MA)   II(CBDA)

CBDA precipitates from solution as it forms and is collected by filtration. CBDA (maximum wavelength of absorption is 232 nm) is then purified by successive recrystallization from acetic anhydride (until the filtrate is colorless) to yield a white solid.

To form the polyamic acid shown at IV in Equation 2, 0.62714 g (3.1977 mmols) of CBDA (II) is added to 60 ml of dry DMAC (dimethylacetamide) and 0.64031 g (3.1977 mmols) of oxydianilinetemperatureold Label, III) are mixed together and reacted in a 3-necked, 100 ml round-bottomed flask fitted with a mechanical stirrer, a nitrogen inlet and a condenser. The reaction was allowed to proceed at room temperature under dry nitrogen for 18.5 hours. The resulting polyamic acid (IV) was precipitated twice into methanol and dried in vacuo at room temperature for 24 hours.

The intrinsic viscosity of the resulting polyamic acid was 1.47 dl/g measured with an Ubbelohde viscometer at 25.00° C. in DMAC.

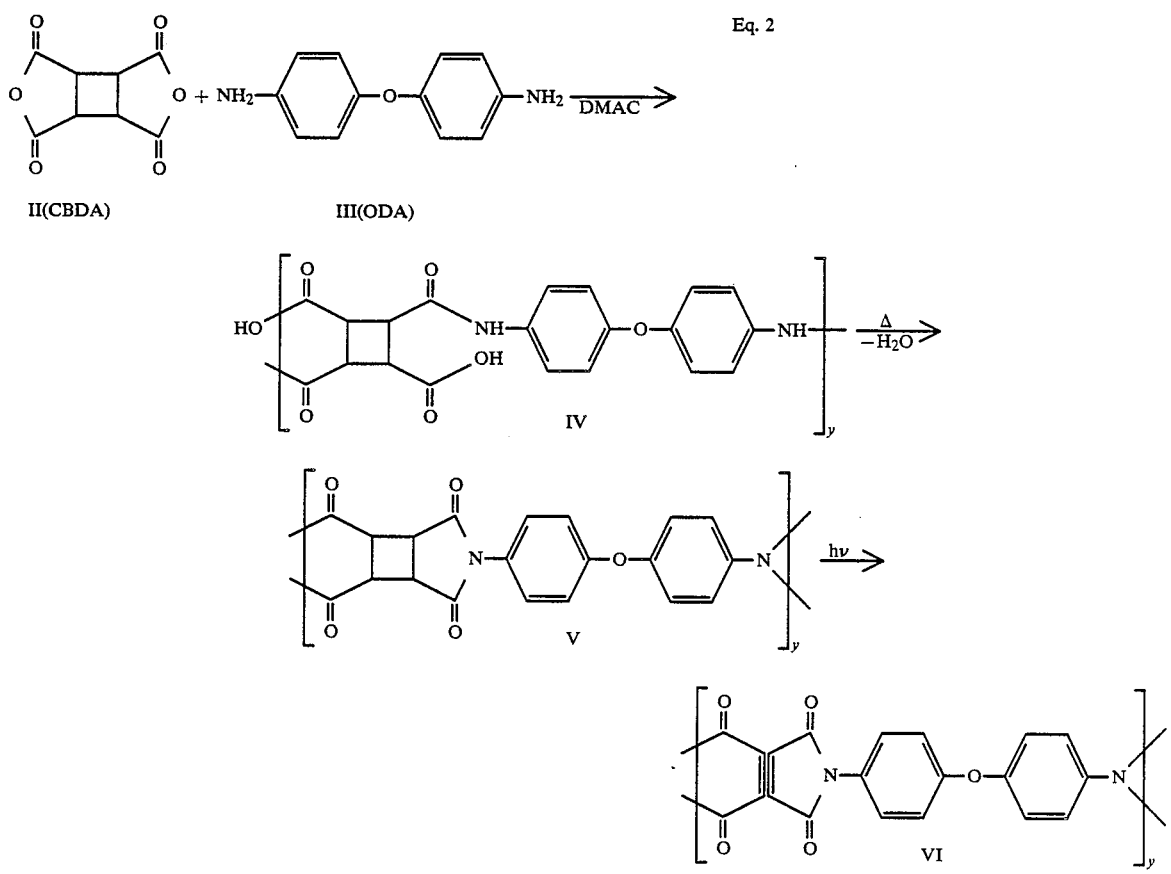

The polyamic acid is cured to the polyimide (V), as shown in Equation 2, by heating films or layers cast by solvent evaporation in a watch glass, in an oven for two hours at 100° C., two hours at 175° C. and two hours at 250° C.

The resulting uniform polyimide film (V) is colorless.

Irradiating a film made of polyimide (V), with ultraviolet light in the range of 230 to 254 nm at incident doses ranging from 10 to 1000 mJ/cm$^2$, results in the scission which breaks the polyimide chain as shown at VI in Equation 2. While the photosensitive polyimide (V) is insoluble in solvents like DMAC and DMF (dimethyl formamide) the exposed compound VI is readily soluble therein.

Samples of the intrinsically photosensitive insoluble polyimide as prepared above, were prepared for dissolution rate studies. The samples were irradiated by flood exposures. In those instances where pattern were generated, appropriate masking procedures were used. Development was carried out by immersing the samples in DMAC, a non-solvent for the unirradiated polyimide, for 45 seconds and then immersing the samples in deionized water for 15 seconds. After developing the samples, they were baked at 140° C. for 30 minutes.

Figure 1:
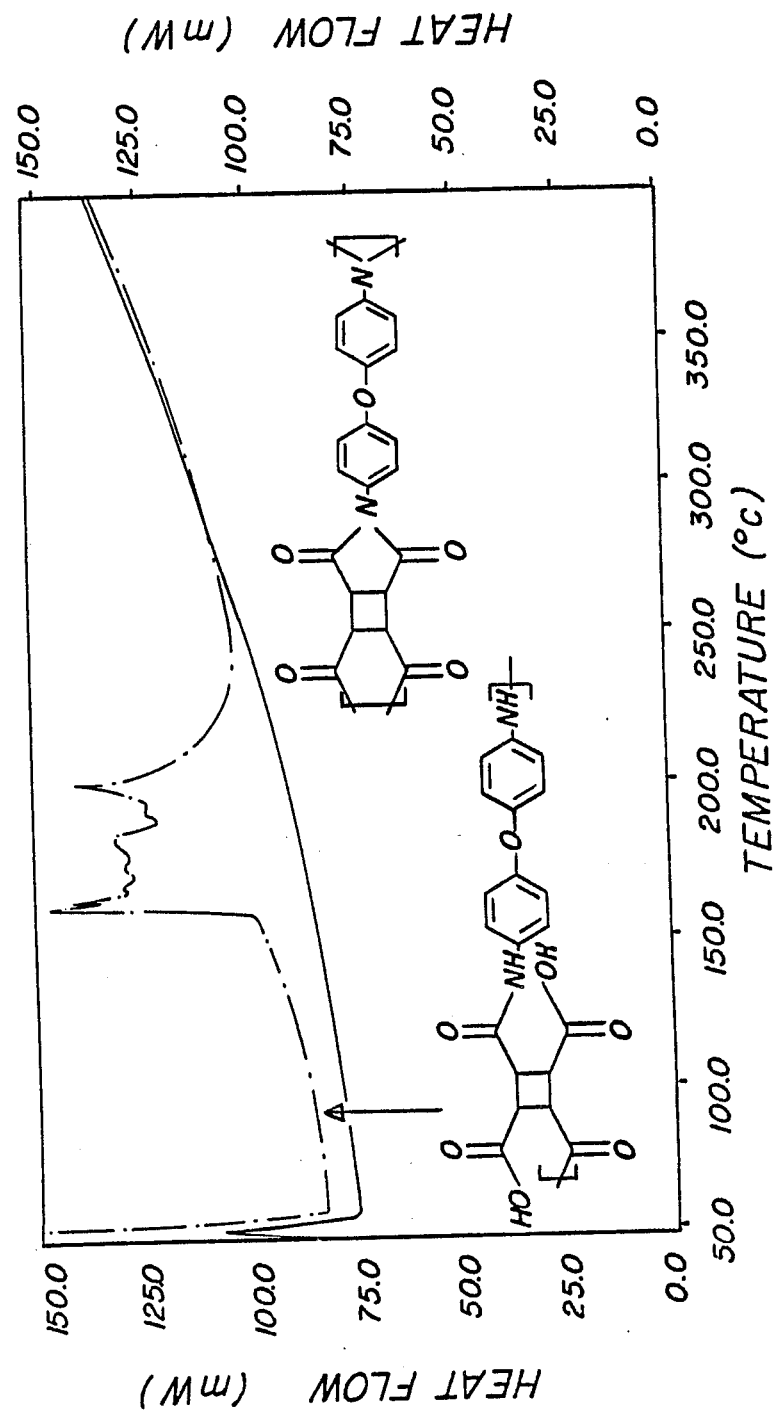
FIG. 1 is a differential scanning calorimogram of the polyamic acid and its conversion into the photosensitive polyimide of the present invention.

FIG. 1 shows a differential scanning calorimogram, under nitrogen, of the polyamic acid. From this scan, it is apparent that conversion of polyimic acid to polyimide takes place in the range of 150° C. to 250° C. Subsequent re-scanning of the sample showed no transitions in this range.

Figure 2:
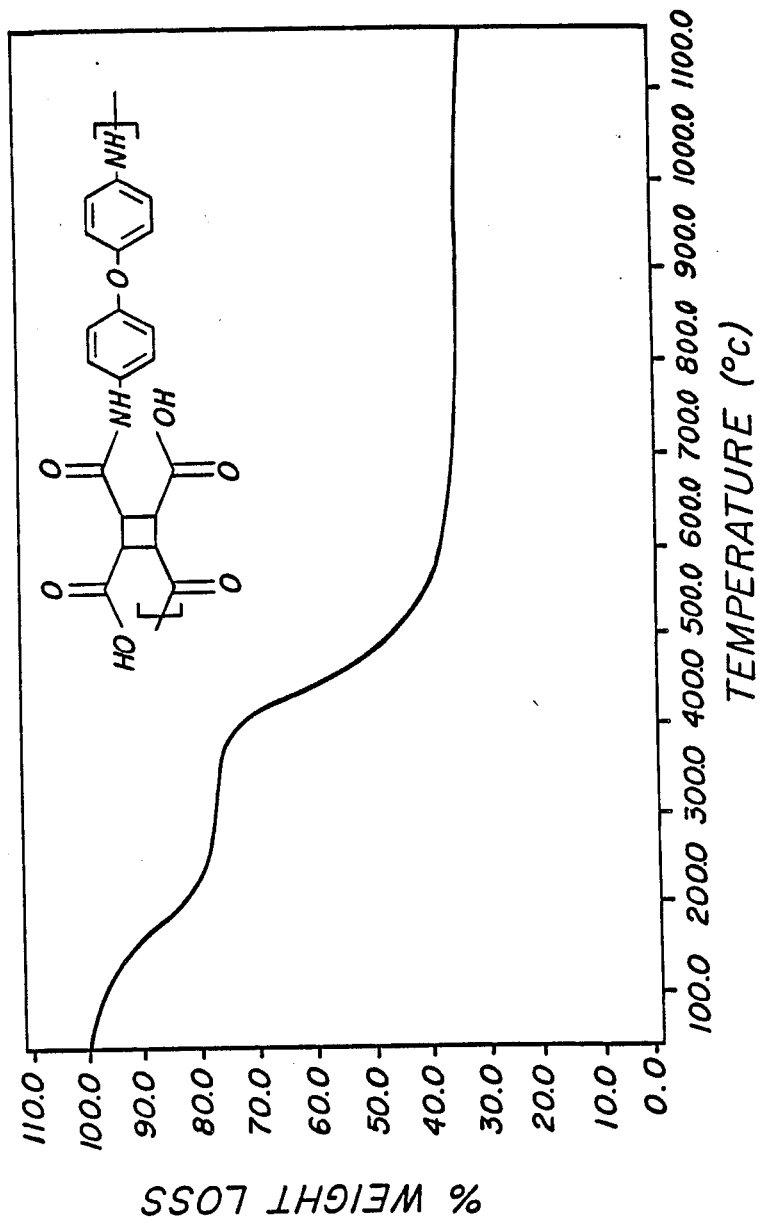
FIG. 2 is a graph plotting weight loss against temperature of the polyamic acid to show its thermogravimetric behavior as it is converted by curing into the photosensitive polyimide structure.

FIG. 2 shows the thermogravimetric behavior, under nitrogen, of the polyamic acid. The weight loss corresponding to the curing of the polyamic acid into the insoluble polyimide structure, can be seen. Once the polyimide is formed, 50% weight loss occurs at about 460° C. and after heating the sample to 1200° C. there is a residual weight of approximately 35%. Thus, despite the incorporation of an aliphatic repeat unit in the chain, the thermal stability of the polyimide is quite high.

Figure 3:
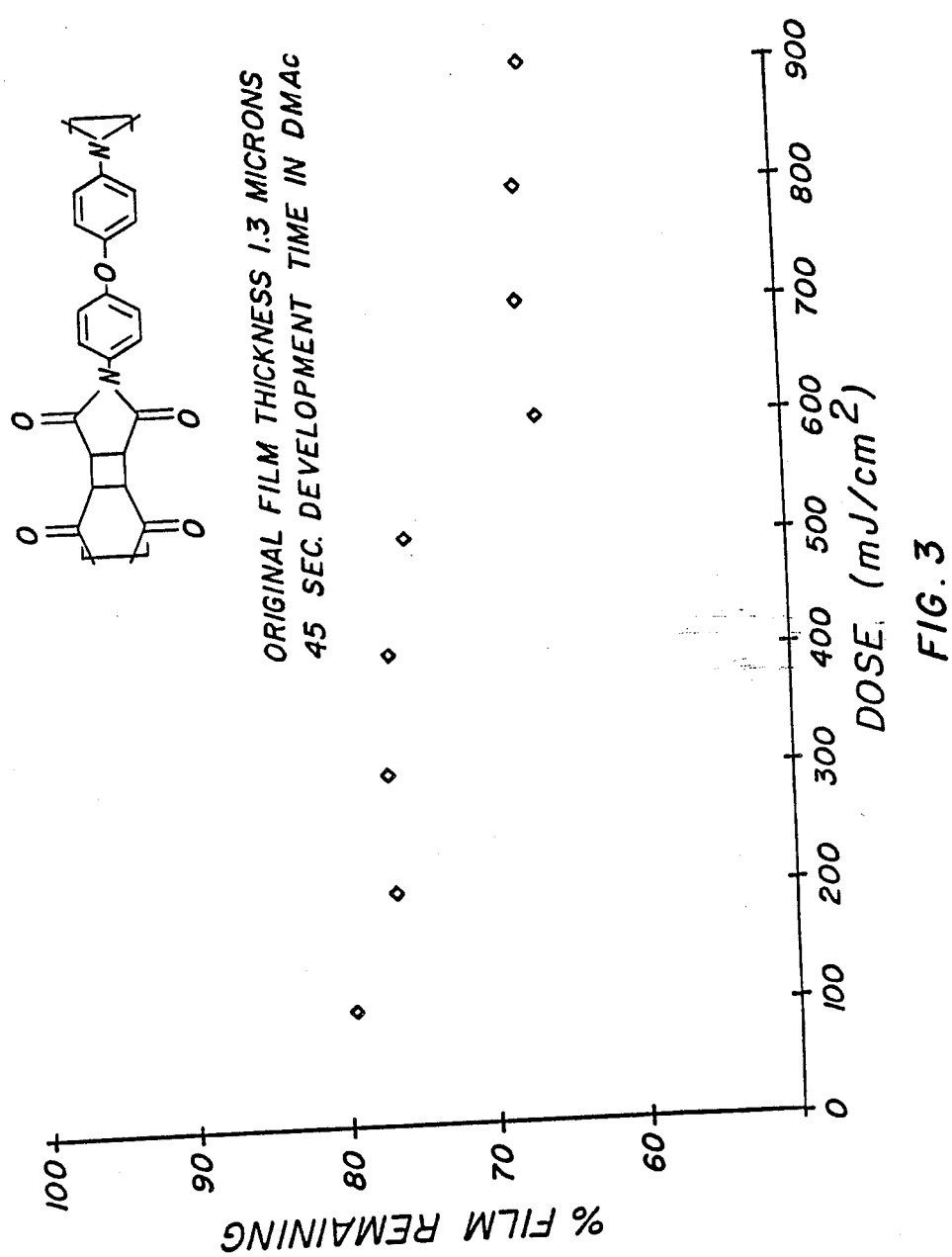
FIG. 3 is a sensitivity curve for the polyimide of the present invention, plotting the percentage of film remaining against irradiation dosage for a layer of the photosensitive polyimide.

FIG. 3 shows the sensitivity curve for the polyimide. In FIG. 3, doses up to 500 mJ/cm$^2$ remove approximately 20% of the initial film thickness. Re-irradiation of the film after solvent development and drying, solubilizes a further portion of the film. Presumably the photoproduct is more absorptive than the cyclobutane ring as is to be expected. Measurements at lower doses yield a sensitivity in the range of 45 mJ/cm$^2$.

According to the present invention thus a readily synthesized polysensitive polyimide is provided which has utility for image generation.

The polyimide V can also be produced by reacting ODA and CBDA in other polar, aprotic solvents, such as DMF, to yield polyamic acid that is cured to the polyimide.

EXAMPLE 2

Dimethyl cyclobutane dianhydride [DMCBDA—see G. O. Schenk et al., Ber. 95, 1642 (1962)]

A solution of methyl maleic anhydride, also known as citraconic anhydride, and 7 wt.-% of benzophenone in 1,4-dioxane was irradiated with a high pressure mercury arc for 18 hr. To form 1,3-dimethyl-1,2,3,4-cyclobutane dianhydride (DMCBDA). The product was collected by filtration and purified by recrystallization from ethyl acetate-hexanes. The product does not melt below 300° C.

DMCBDA—ODA polyimide

To a dry, 100 ml, 3-necked, round-bottomed flask fitted with a mechanical stirrer, nitrogen inlet and condenser was added 0.93016 g (4.6452 mmols) of oxydianiline (ODA), 60 ml of dry DMAC and 1.04132 g (4.6452 mmols) of DMCBDA. The reaction was allowed to proceed to room temperature under dry nitrogen for 24 hours and 80° C. for 24 hours. The resulting polyamic acid was precipitated twice into methanol and then dried in vacuo at room temperature. Films of the polyimide derived from this material by cyclization could be prepaed as described above. When irradiated under the conditions previously described, this polymer also proved to be photosensitive and micron-sized images could be generated by washing the irradiated films with ethyl acetate. This result indicates that substituents on the cyclobutane ring do not interfere with the photosensitivity of the polymers of the this class.

COMPARATIVE EXAMPLE

CBDA-alicyclic diamine polyimide

To a dry, 100 mL, 3-necked, round-bottomed flask fitted with a mechanical stirrer, nitrogen inlet and condenser was added 0.74067 g. (3.5208 mmols) of 4,4'-methylene bis (cyclohexylamine) which had been previously distilled (163°–4° C., 6 torr), 60 mL of dry DMAC and 0.69049 g. (3.5208 mmols) of CBDA. The reaction was allowed to proceed room temperature under dry nitrogen for 20 hr. The resulting polyamic acid was not isolated. Silicon wafers were spincoated with this solution and then terminally converted to polyimide according to the previously given heating cycle. When irradiated under the conditions previously described, this polymer was not found to be photosensitive, indicating that the aromatic portion of the diamine may perform a role (sensitizer) in the imaging process.

Figure 4:
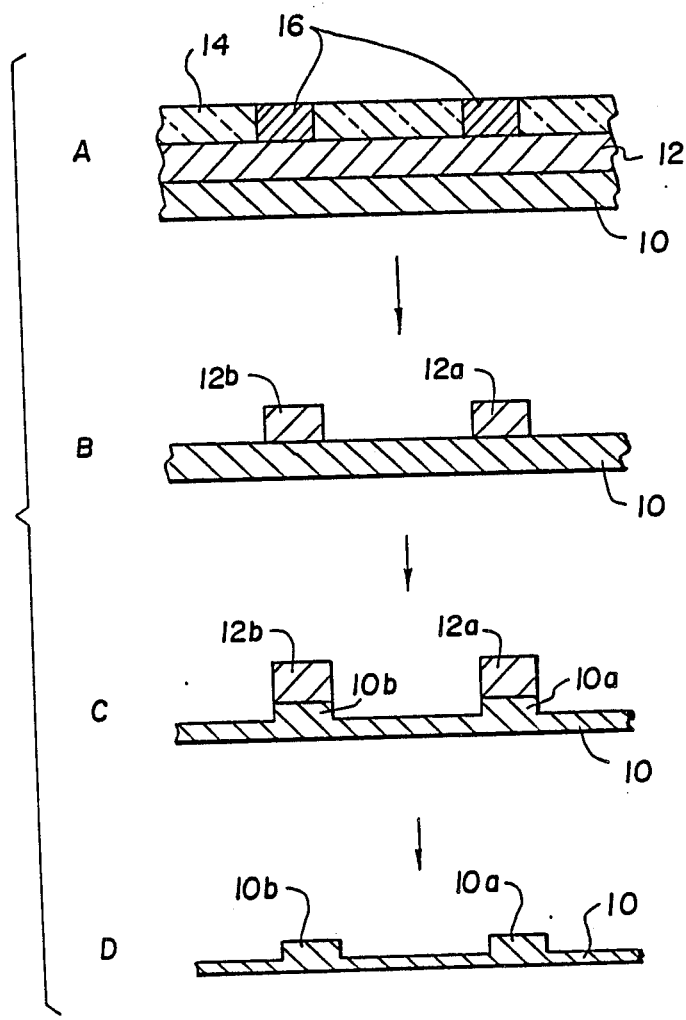
FIG. 4 is a series of schematic side views showing the progressive steps in a photolitghographic process in accordance with the present invention.

Turning now to FIG. 4, a method of forming a patterned layer for semiconductor structures is disclosed, which utilizes the inherently photosensitive insoluble polyimide of the present invention.

FIG. 4 illustrates steps A through D of a trench method used in accordance with the present invention. At step A, a substrate 10 advantageously made of semiconductor material has a covering layer 12 of polyimide made in accordance with the present invention. A transparent mask layer 14 covers the upper surface of polyimide layer 12 and includes opaque mask regions 16. The structure of step A is irradiated, its mask is removed, and the pattern is solvent developed to form the structure of step B which includes the substrate 10 and the un-irradiated polyimide portions 12a and 12b that had been under the opaque regions 16 in step A.

The structure of step B is then subjected to etching of the substrate to form the trenched substrate shown in step C where substrate 10 is provided with raised regions 10a and 10b positioned under polyimide regions 12a and 12b.

The structure of step C is then subjected to removal of the polyimide, for example, by plasma etching to form the structure of step D, having substrate 10 with raised regions 10a and 10b.

Another technique which can be used in accordance with the present invention is to subject the structure of step B to metal deposition which deposits metal between the polyimide regions 12a and 12b. This structure can then be subject to plasma etching to remove the polyimide regions 12a and 12b and leave the metal regions which are now spaced from each other.

While a specific embodiment of the invention has been showed and described in detail to illustrate the application of the principles of the invention, it will be understood that the invention may be embodied otherwise without departing from such principles.

What is claimed is:

1. A method of forming a patterned layer for a semiconductor structure comprising:

forming a layer of insoluble polyimide having the formula:

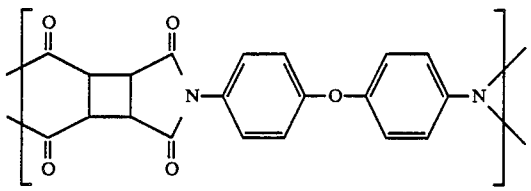

irradiating the layer with a pattern of ultraviolet light to produce exposed and unexposed areas in the layer, the exposed areas becoming soluble; and dissolving the exposed areas from the layer using a solvent to form the patterned layer.

2. A method according to claim 1 wherein the solvent is a polar aprotic solvent.

3. A method according to claim 1 including irradiating the layer with ultraviolet light having a wavelength from about 230 to 254 nm and an incident dosage of from about 10 to 1000 mJ/cm$^2$.

4. A method according to claim 1 wherein the insoluble polyimide is formed by irradiating maleic anhydride to form cyclobutane tetracarboxylic dianhydride, reacting the cyclobutane tetracarboxylic dianhydride with oxydianiline to form polyamic acid and curing the polyamic acid to form the insoluble polyimide.

5. A method according to claim 4 including curing the polyamic acid into polyimide by heating the polyamic acid.

6. A method according to claim 5 including reacting the cyclobutane tetracarboxylic dianhydride with the oxydianiline in the presence of a solvent chosen from a group consisting of dimethylformamide and dimethylacetamide.

* * * * *